United States Patent
Foley

(10) Patent No.: US 12,021,543 B2
(45) Date of Patent: Jun. 25, 2024

(54) BASELINE WANDER COMPENSATOR AND METHOD

(71) Applicant: MACOM Technology Solution Holdings, Inc., Lowell, MA (US)

(72) Inventor: David Foley, Sophia Antipolis (FR)

(73) Assignee: MACOM Technology Solutions Holdings, Inc., Lowell, MA (US)

(*) Notice: Subject to any disclaimer, the term of this patent is extended or adjusted under 35 U.S.C. 154(b) by 197 days.

(21) Appl. No.: 17/836,722

(22) Filed: Jun. 9, 2022

(65) Prior Publication Data
US 2023/0403023 A1   Dec. 14, 2023

(51) Int. Cl.
| H03M 1/12 | (2006.01) |
| H03M 1/00 | (2006.01) |
| H03M 1/10 | (2006.01) |

(52) U.S. Cl.
CPC ......... H03M 1/1076 (2013.01); H03M 1/004 (2013.01); H03M 1/1095 (2013.01)

(58) Field of Classification Search
CPC ... H03M 1/1076; H03M 1/004; H03M 1/1095
See application file for complete search history.

(56) References Cited

U.S. PATENT DOCUMENTS

| 4,303,896 | A | 12/1981 | Siabinski | |
| 5,699,022 | A | 12/1997 | Tovar | |
| 6,600,338 | B1 * | 7/2003 | Nguyen | H03K 19/018528 327/333 |
| 7,466,971 | B1 * | 12/2008 | Roo | H04B 3/32 455/295 |
| 8,923,166 | B2 | 12/2014 | Ceekala et al. | |
| 8,970,300 | B2 | 3/2015 | Piepenstock | |
| 9,985,684 | B2 | 5/2018 | Chang | |
| 10,135,566 | B2 * | 11/2018 | Navid | H04L 1/0036 |
| 10,348,534 | B1 * | 7/2019 | Sreeramaneni | H04L 25/021 |
| 2004/0251982 | A1 | 12/2004 | Gondi | |
| 2008/0063091 | A1 | 3/2008 | Dong et al. | |

(Continued)

OTHER PUBLICATIONS

Mensink, et al., A CMOS "Soft-Switched" Transconductor and its Application in Gain Control and Filters, IEEE Journal of Solid-State Circuits, vol. 32, No. 7, © 1997 IEEE, Jul. 1997, pp. 989-998.

(Continued)

*Primary Examiner* — Jean B Jeanglaude
(74) *Attorney, Agent, or Firm* — Weide & Miller, Ltd.

(57) ABSTRACT

A baseline wander and offset correction system having inputs configured to receive input signals to be transmitted. Also part of the system is a driver circuit configured to receive and amplify the input signals. The driver circuit is configured with one or more transistors having an optional back bias terminal. A replica circuit receives the input signals and responsive thereto, generates back bias signals which are provided to the back bias terminal of the one or more transistors to change the back bias in response to the input signals having consecutive one values or consecutive zero values. This reduces the size of the one or more AC coupling capacitors located between the driver circuit and a channel. An embodiment may store back bias values in a memory. The back bias values are processed by DAC to generate the back bias signals for offset correction.

20 Claims, 10 Drawing Sheets

(56) References Cited

U.S. PATENT DOCUMENTS

| | | |
|---|---|---|
| 2008/0253439 A1 | 10/2008 | Shakiba |
| 2010/0074310 A1* | 3/2010 | Roo .................. H04B 3/32 |
| | | 375/346 |
| 2014/0133604 A1 | 5/2014 | Beukema et al. |
| 2016/0080176 A1 | 3/2016 | Kotagiri et al. |
| 2017/0093525 A1 | 3/2017 | Navid |
| 2017/0099163 A1 | 4/2017 | Dong |
| 2017/0250682 A1* | 8/2017 | Fernández Robayna .................... |
| | | H03K 5/007 |
| 2019/0215198 A1* | 7/2019 | Sreeramaneni .......... H04B 1/16 |
| 2020/0028719 A1 | 1/2020 | Hu |

OTHER PUBLICATIONS

"What is Automatic Gain Control?", Editorial Team, Everything RF, 1 page, date unknown.

* cited by examiner

BASELINE WANDER COMPENSATOR AND METHOD

1. FIELD OF THE INVENTION

The invention relates to data communication systems and in particular to a method and apparatus for compensating for baseline wander and/or offset.

2. RELATED ART

Baseline wander (BLW) can significantly degrade the performance of down-stream receivers (RX) because of signal attenuation that impacts the decision cross-over point of the received data. The BLW is influenced by the consecutive identical digit (CID) content of the transmitted data-streams. This results in a higher bit error rate, which is unwanted.

The traditional approach to BLW compensation is to employ large AC coupling capacitors between the RX and the transmitter (TX). These AC coupling capacitors are used to isolate the RX common-mode (CM) biasing from the TX output common mode. The size of these capacitors can become very significant as the BLW becomes more of an issue. As the size of the capacitors increase, each capacitor consumes valuable die area, package area, or circuit board area. In addition, the cost and complexity of placing large capacitors also increases. In addition, for legacy products, it may not be feasible to change the capacitors.

SUMMARY

To overcome the drawbacks of the prior art and provide additional advantages, a baseline wander correction system is disclosed. In one embodiment, the system comprises one or more inputs, configured to receive one or more input signals to be transmitted, and a driver circuit configured to receive and amplify the one or more inputs. The driver circuit is configured with one or more transistors having a back bias terminal. A replica circuit is configured to receive the one or more input signals, and responsive to the one or more input signals, generate one or more back bias signals which are provided to the back bias terminal of the one or more transistors to change the back bias in response to the one or more input signals having consecutive one values or consecutive zero values. One or more AC coupling capacitors may be provided between the driver circuit and a channel to attenuate the voltage switch, such as in response to long CID patterns. The current flowing through the differential pair (MN1 and MN2). Adjusting the back bias signal reduces the output swing, which allows for smaller AC coupling capacitors, capacitors.

In one embodiment, the replica circuit includes control logic that is configured to generate and output signal in proportion to the input signals. It is contemplated that the replica circuit may include one or more current sources which increase or decrease current output responsive to the one or more input signals having consecutive one values or consecutive zero values. In one configuration, the replica circuit comprises two or more variable current sources which generate an output current based on one or more input signals, such that the output of the two or more variable current sources determine the back bias signal.

The system may further comprise an inverting buffer configured to invert the value of the one or more input signals to create an inverted input signal and provide the inverted signal to at least one of the two or more variable current source. The system may further comprise one or more counters and one or more digital to analog converters, the one or more counters configured to adjust a counter value based on the number of ones and zeros in the one or more input signals. The baseline wander correction system may be configured as a differential signal system and the one or more inputs is two inputs.

Also disclosed is a method for correcting baseline wander in an amplified signal. In one embodiment, this method comprises receiving one or more signals, such that the one or more signals are represented by logic high values and logic low values. This method also provides the one or more signals to an amplifier for amplification prior to transmission over a channel and provides the back bias signal to one or more transistors within the amplifier to control the back bias of the one or more transistors. The amplifier (which may be part of a driver) amplifies the one or more signal with the amplifier to create one or more amplified signals such that the back bias signal adjusts the turn on voltage of the one or more transistors, which changes the current flowing through the one or more transistors, then providing the one or more amplified signals to one or more AC coupling capacitors located between the amplifier and the channel. Controlling the back bias signals adjusts the output swing. This adjustment can compensate for the signal attenuation resulting from long CID patterns transmitted through the AC caps. This eliminates or reduces the need to enlarge the AC caps to compensate for this attenuation.

In one embodiment, the amplified signal is a differential signal. As discussed herein, the changes to the current flowing through the one or more transistors adjusts the output voltage swing. This method may further comprise providing the one or more signals to a replication circuit configured to generate a back bias signal. In one configuration, the replication circuit includes one or more variable current sources that generate the back bias signal based on the one or more received signals. This method of operation may further comprise generating a counter value with a counter, the counter value determined by the consecutive high and consecutive low values in the one or more received signals. This method may further comprise retrieving the back bias signal value from a memory and converting the back bias signal value to the back bias signal with a DAC.

Also disclosed is an offset correction system comprising one or more inputs configured to receive one or more input signals to be transmitted and a driver circuit configured to receive and amplify the one or more input signals. The driver circuit configured with one or more transistors having a back bias terminal. A memory configured to store offset adjustment values and a user interface configured to access the memory to store the offset adjustment values in the memory. Also part of this embodiment is a DAC configured to receive the offset adjustment values from memory, convert the offset adjustment values to back bias signals, and provide the back bias signals to the back bias terminal of the one or more transistors such that the back bias signals are adjusted in response to the one or more inputs signals having consecutive one values or consecutive zero values.

In one embodiment, the offset correction system is configured as a differential signal system and the one or more inputs is two inputs. The offset correction system may further comprise an AC coupling capacitors located between an output of the driver and a channel, such that adjusting the back bias signals changes the charge on the AC coupling capacitors. In one embodiment, the system is configured such that the back bias signal adjusts a turn on voltage of the one or more transistors, which changes the current flowing through the one or more transistors. This system may further comprise testing an offset of the driver circuit and loading offset adjustment values via the user interface into the memory.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

To overcome the drawbacks of the prior art and provide additional benefits, disclosed is a compensation system for baseline wander (BLW) and/or signal offset. The disclosed system addresses the BLW issue without the need to enlarge existing common mode isolating AC coupling capacitors.

Figure 1:
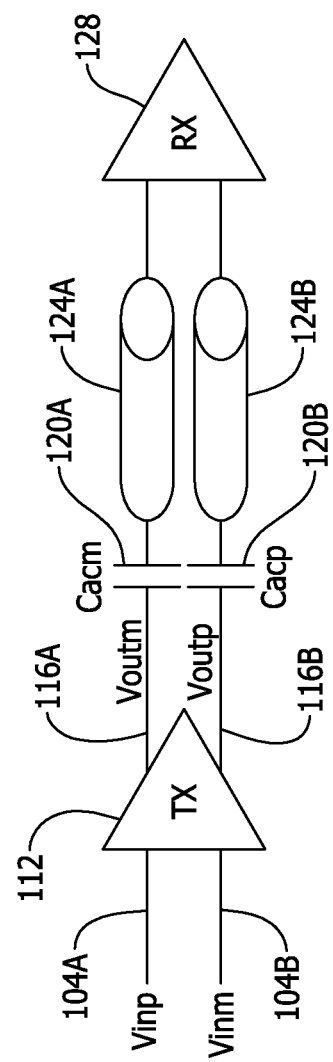
FIG. 1 illustrates an example environment of use of the BLW compensation system.

FIG. 1 illustrates an example environment of use of the BLW compensation system. This is but one possible environment of use and it is contemplated that the BLW compensation system may find use in any communication system or circuit that suffers from BLW or offset. The offset cancellation is different than the BLW compensation, in that it is not dependent on the CID patterns. The offset cancellation is used to compensate for some inherent offset in the transmitter circuit that can come from process mismatch on the differential pair devices. The differential pair devices can then have different threshold voltage VT and therefore different Ids, which results in different output voltage swing on Voutp and Voutm.

As shown in FIG. 1, which is configured as a differential signal system, are input Vinp 104A and Vinm 104B which connect to a driver 112. The driver 112 prepares and amplifies the signal from transmission over a channel 124A, 124B. Coupling capacitors 120A, 120B may be located between the driver 112 and the channel 124A, 124B or the coupling capacitors may be on the receiver side of the channel. At the opposing end of the channels 124A, 124B connects to a receiver 128. The receiver 128 outputs the signal either in differential format or singled ended format.

Figure 2:
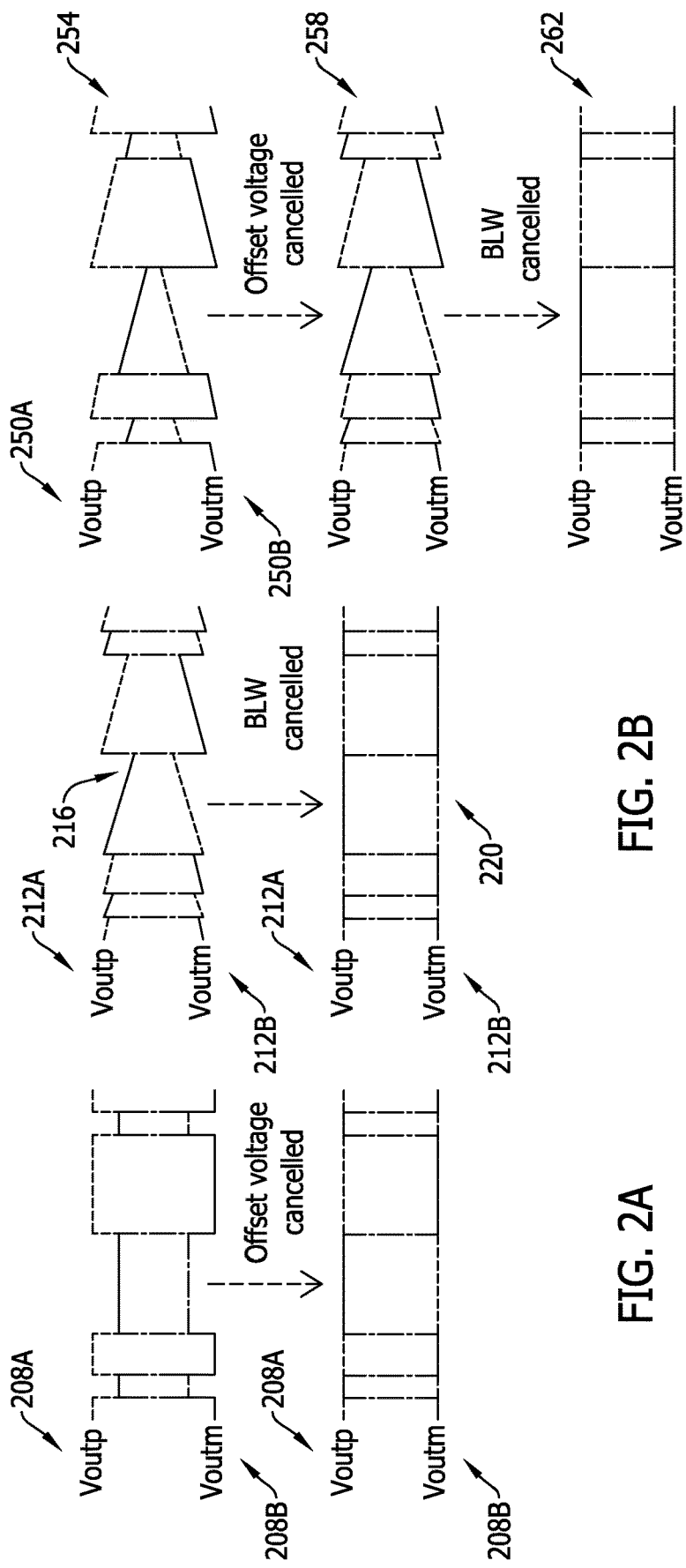
FIG. 2A, illustrates an exemplary signal plot of signals with offset and after offset correction.
FIG. 2B illustrates an exemplary signal plot of signals with baseline wander (BLW) and after BLW correction.
FIG. 2C illustrates and exemplary signal plot of signals with offset and baseline wander (BLW), and after offset correction and BLW correction.

FIG. 2A, illustrates an exemplary signal plot of signals with offset and after offset correction. These signal plots are for discussion only and not indicative of actual data signal. As shown output signals Voutp 208A, and output Voutm 208B are shown. In the upper plot, the signal 208A is offset or shifted upward from a center point while signal Voutm 208B is shifted or offset downward from the center point. It is also possible that only one of the signals 208A, 208B are shifted, depending on the location of the DC common mode (center point). In this example, a DC offset results in an output common mode shift between voltages Voutp & Voutm. While the AC coupling capacitors can block this DC common mode shift at the receiver side, the common mode shift can impact the driver performance as each side of the driver now operates under different voltage conditions. The output swing on Voutp and Voutm can therefore differ. In the embodiments disclosed herein, the offset could also be directly manifested as an unmatched voltage swing between Voutp & Voutm. The same compensation can be used to adjust this unmatched swing.

This offset can be cancelled through the addition of a fixed magnitude offset in the Isrcp & Isrcn current sources (shown in FIG. 6 below) in the replica-TX circuit. In the embodiments disclosed herein, the offset could also be directly manifested as an unmatched voltage swing between Voutp & Voutm. The same compensation can be used to adjust this unmatched swing.

In the lower signal plots, the offset is compensated such that the lowest magnitude of the p signal 208A is at the same voltage as the lowest point of the n signal 208B. Similarly, the highest magnitude of the p signal 208A is at the same voltage as the highest point of the n signal 208B. As a result, there is no or little offset between the two signals. The system disclosed below can compensate for and correct offset FIG. 2B illustrates an exemplary signal plot of signals with baseline wander (BLW) and after BLW correction. These signal plots are for discussion only and not indicative of actual data signal. As shown output signals Voutp 212A, and output Voutm 212B are shown. In the upper plot, the signals 212A, 212B decrease in magnitude in response to a consecutive string of high (1) or low (0) values. This appears as the signal pinching together at point 216, or baseline wandering toward zero or center value. It is also possible that only one of the signals 212A, 212B are pinched In the lower signal plots shown in FIG. 2B, the BLW is compensated for and corrected such that at point 220, the signals 212A, 212B maintain their magnitude and do not pinch or wander to the center point. As a result, there is a reduced amount of baseline wander in the two signals. The system disclosed below can compensate for and correct baseline wander.

As can be seen in FIG. 2B, baseline wander cancellation requires a more dynamic adjustment of the back bias voltages. The replica-TX circuit shown in FIG. 3 and FIG. 6 gradually adjusts the back bias voltage as the time duration of the signal pulse width increases (number of consecutive ones or zeros. The baseline wander problem increases as the CID duration increases.

FIG. 2C illustrates and exemplary signal plot of signals with offset and baseline wander (BLW), and after offset correction and BLW correction. As shown, the top plot 254 suffers from both offset and BLW. The second plot 258 has had the offset corrected, such that the minimum and maximum for both signals 250A, 250B are at the same magnitude. The bottom plot 262 illustrates the signal plots 250A, 250B after BLW compensation.

Figure 3:
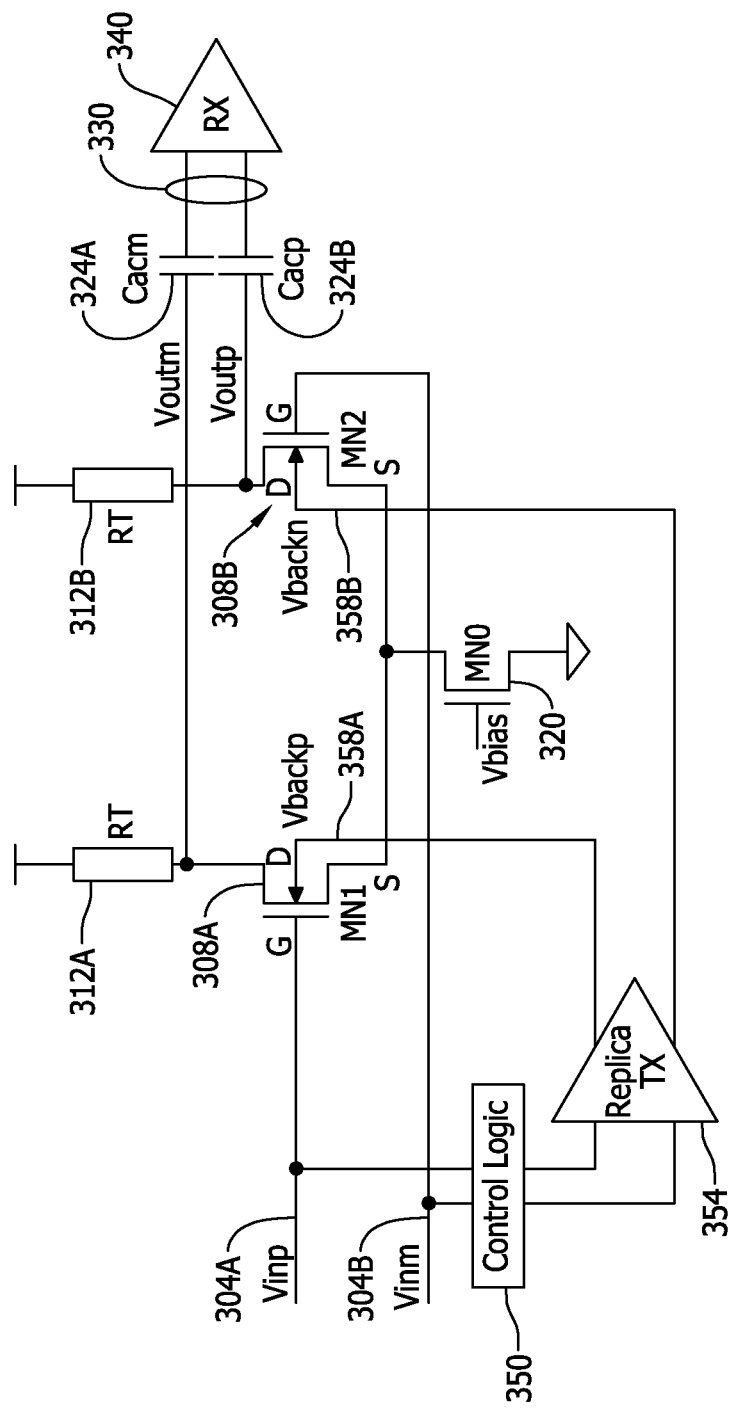
FIG. 3 is a circuit diagram of an example embodiment of a baseline wander compensator with optional offset correction.

A circuit diagram of an example embodiment of the proposed BLW compensator is shown in FIG. 3. This is but one possible example embodiment of a BLW compensation circuit. Other configurations are possible based on the disclosed and figures. In this implementation, the BLW compensator is applied to a TX driver circuit that has been designed on a silicon-on-insulator (SOI) CMOS process. This process facilitates the adjustment of the back-bias voltages (Vbackp & Vbackn) of the NFET differential input pair (MN1 & MN2) of the TX.

Turning to the circuit layout, differential inputs 304A, 304B connect to gate terminals of transistors 308A, 308B. The transistors 308A, 308B are on in a differential pair configuration. The source terminals of each transistors 308A, 308B connect to a termination resistor 312A, 312B. The drain terminal of each transistor 308A, 308B connect to a bias element, such as bias transistor 320 which is controlled by a bias voltage Vbias to bias the differential paired transistors 308A, 308B.

The drain terminals of the transistors 308A, 308B also connect to output paths which connect to AC coupling capacitors Cacn, Cacp 324A, 324B. These AC coupling capacitors 324A, 324B are used to isolate the RX common-mode (CM) biasing from the TX output common mode. The opposing terminals of the AC coupling capacitors 324A, 324B connect to the channel 330, and the opposing side of the channel connects to a receiver. The channel may comprise any type of channel, such as but not limited to a wired channel, optic channel, or any other type of channel. The receiver 340 is configured to receive the transmitted signal, which may be singled ended or differential configuration, and isolate and amplify the received signal.

As discussed above, a string of consecutive 1s or 0s will lead to baseline wander and the prior art method of compensating was to use ever larger coupling capacitors 324A, 324B as CID durations increased. Instead of increasing the size of the coupling capacitors 324A, 324B, control logic 350 and a replica circuit is disclosed that dynamically controls a back bias value for the transistors 308A, 308B, which in turn control the swing on the output of the driver/amplifier.

As shown, the inputs 304A, 304B that carry Vinp and Vinm also connect to control logic 350 configured to react in proportion to the input signal characteristics. The control logic 350 has one or more outputs that feed into a replica circuit 354 (shown as a replica transmitter or amplifier) configured to generate a Vbackp signal and Vbackm signal, which are provided via path 358A, 358B to back bias the transistors 308A, 308B. The signals Vbackp signal and Vbackm signal are provided to back bias terminals for the transistors 308A, 308B.

Adjusting the back bias voltage of the NFET has a similar effect as adjusting the threshold voltage (VT) of the device. The threshold voltage could be defined as the turn-on voltage of the device. As a result, in terms of the threshold voltage (VT), as the VT of the device is adjusted, the gate-source voltage (Vgs) also changes. The gate-source voltage (Vgs) which is the voltage across the gate terminal and the source terminal of a transistor. The voltage Vgs dictates the current (Ids) flowing between the source and drain of the device. The current Ids then dictates the output voltage swing. As the gate-sour voltage Vgs changes, the drain-source voltage (Vds) of the biasing NFET (MN0) 320 also changes. In one embodiment, the Vbias voltage provided to the biasing transistor 320 can be derived from a NFET current mirror device. This change of Vds on a narrow CMOS bias NFET 320 results in a change in the current flowing in the biasing device. Therefore, this back-bias adjustment results in a different current flowing through each of the differential pair devices when the biasing device 320 (bias NFET) is fully switched-on.

As the consecutive identical digits (CID) increases the replica-TX circuit will increase the back bias voltage for data stream components with longer CID durations. The replica-TX may adjust the back bias every bit period or after a coarse number of bit periods. The objective is to reduce the baseline wander that this may range from complete cancellation to baseline wander reduction. The adjustment interval and the magnitude of the adjustment may be dictated by the implementation complexity and by the receiver system requirements on baseline wander. Both the inherent offset and unbalanced DC content may use a differential compensation approach where when Vbackp is increased, Vbackm is decreased or vise-versa. During the baseline wander compensation, Vbackn and Vbackp would both be compensated in the same manner because the impact of the baseline wander is to attenuate both Voutp and Voutm during long CID events. The waveforms in FIG. 2C show the impact of both an offset voltage problem and baseline wander. As discussed earlier, it is better to first compensate for the offset problem and to then compensate for baseline wander.

It is further disclosed that the replica-TX and the TX circuit should align in time. A such, it may be optionally necessary to utilize delays, RC circuit, buffers, or any other type circuit or delay to establish time alignment. It is also contemplated that the system may be configured to only enable the replica-TX circuit after a certain number of CIDs such as thirty, or any other number. The back bias voltage can be returned to its default value at the end of the CID chain when the data transitions to a different level. In one embodiment, an XOR circuit could be used to detect a transition and to reset the replica-TX back to default values.

Figure 4:
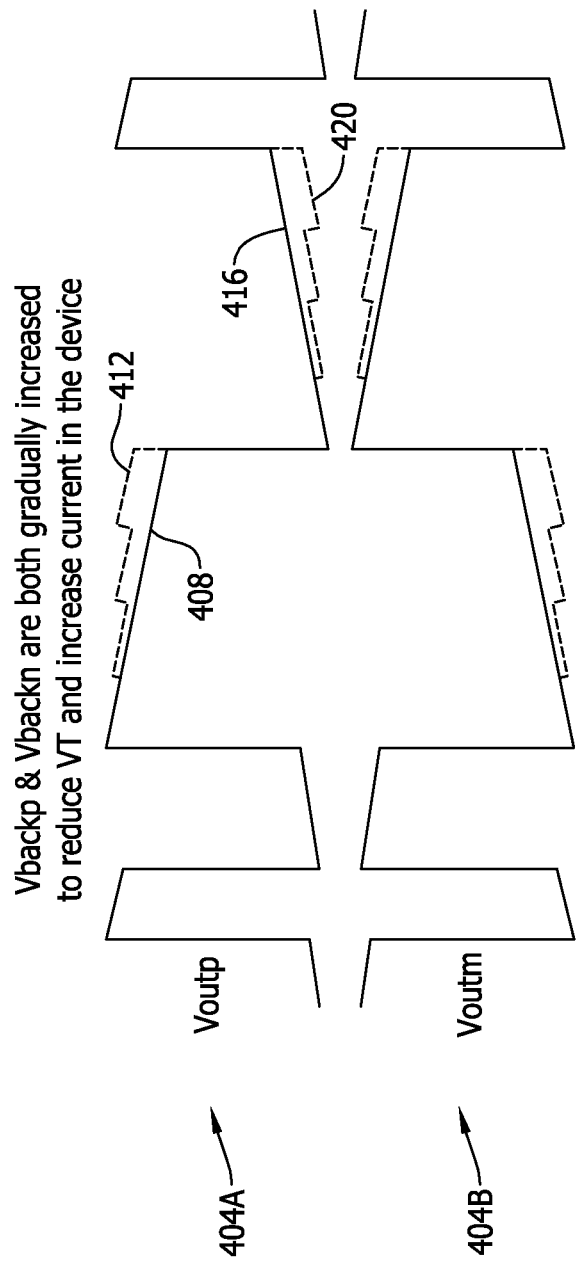
FIG. 4 illustrates exemplary plots of signals before and after base line wander correction.

FIG. 4 illustrates exemplary plots of signals before and after base line wander correction. The two differential signals are shown 404A, 404B, referred to as Voutp and VoutM. As can be seen, at signal portion 408 the magnitude of the signal wanders downward to a lower magnitude. This increases bit error rate and is unwanted. With baseline wander correction, at signal portion 412 the signal magnitude is incrementally increased to counter the effects of the baseline wander. Similarly, at signal portion 416 the signal magnitude is increasing in value, when it should be maintained at a low or zero level. With baseline wander correction, the magnitude of the signal is also incrementally decreased as shown by signal portion 420. As a result, this system overcomes the drawbacks of the prior art.

Figure 5:
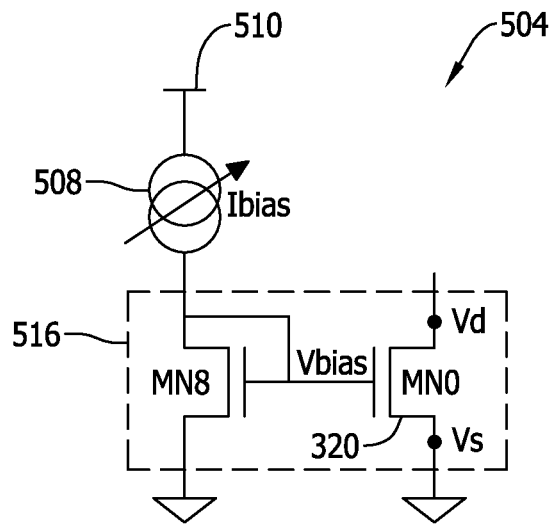
FIG. 5 illustrates an example embodiment of a bias circuit, such as the bias signal source in FIG. 3.

FIG. 5 illustrates an example embodiment of a bias circuit, such as the bias signal source in FIG. 3. This is but one possible embodiment and as such, other configurations are possible which do not depart from the scope of the claims. As shown, a variable or adjustable current source 508 is provided between a supply node 510 and a current mirror 516. The current mirror 516 includes the transistor MN0 320 as shown in FIG. 3. The bias circuit 504 creates the bias voltage that is provided to the source terminals of transistors MN1 MN2 shown in FIG. 3.

Figure 6:
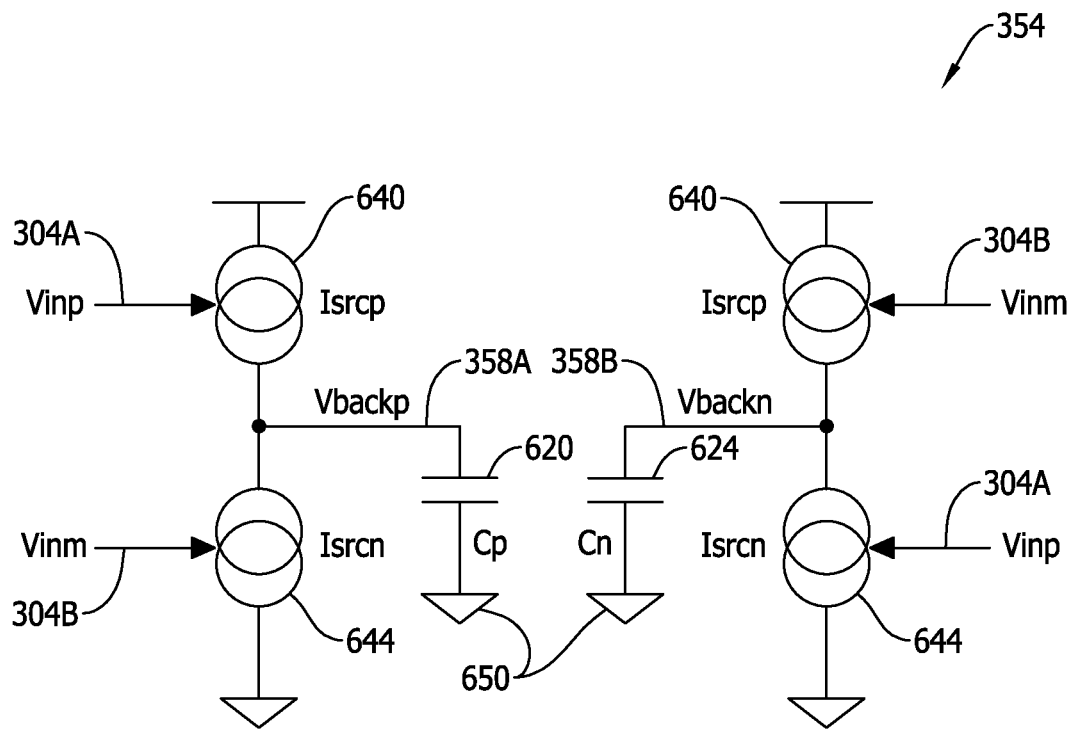
FIG. 6 illustrates an example embodiment of the replica transmitter circuit 354 shown in FIG. 3.

FIG. 6 illustrates an example embodiment of the replica transmitter circuit 354 shown in FIG. 3. This is but one possible embodiment and as such, other configurations are possible which do not depart from the scope of the claims. In this embodiment, the inputs Vinp, Vinm 304A, 304A, as referenced in FIG. 3, connected to the current sources. The current sources comprise four current sources, labeled as Isrcp 640 and Isrcn 644, that are used to either charge or discharge the differential storage capacitors, Cp 620 and Cn 640. The terminals of capacitor Cp 620 connect to a node between each current source and a ground node 650. The signal at node 358A defines voltage Vbackp and the signal at node 358B defines the voltage Vbackn, which are used to back bias the transistors MN1 and MN2 in FIG. 3. The TX circuit input voltages, Vinp and Vinm, dictate whether these current sources are enabled or disabled and as such, act as control signals to control operation of the current sources 640, 644. In one embodiment, the magnitude of the current in the current sources can be programmed to a level desired for the rate of BLW compensation.

The purpose of the replica circuit 354 is to effectively track the data to be transmitted (data-stream) without impeding the transmitter performance. By default, the back-bias voltages are equal, although in other embodiments the two back bias voltages Vbackn, Vbackp may be set to different values. An example back bias voltage range (signals Vbackp, Vbackn) would be from 0 V to 2 V. It is contemplated that the default value could be set to 1V to facilitate the adjustment in both directions. The circuit inputs may be filtered (or de-serialized) to operate at a lower rate to facilitate ease of circuit implementation due to the circuit being able to operate at a lower speed. The replica transmitter circuit offers the additional advantage of not having to probe the output voltages of the transmit circuit and therefore reduces output loading, which can have an impact on the transmitter bandwidth.

Figure 7:
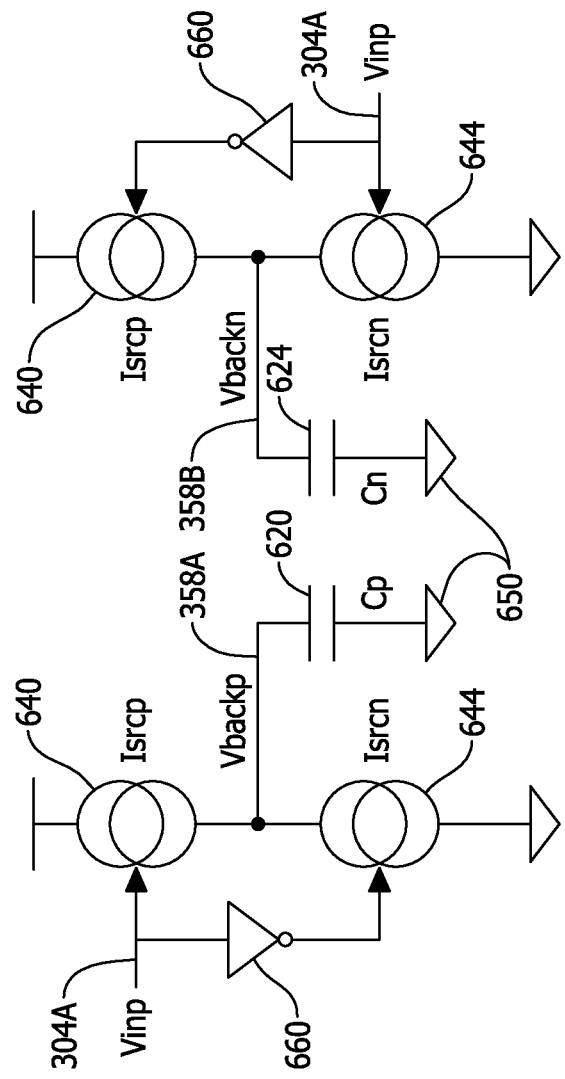
FIG. 7 is an alternative embodiment of the replica circuit shown in FIG. 3.

FIG. 7 is an alternative embodiment of the replica circuit shown in FIG. 3. This is but one possible alternative embodiment. As compared to FIG. 6, identical or similar elements are labeled with identical reference numbers. In this embodiment, the voltage Vinp is provided to not only the current source 640, but also to an inverting buffer 660 or other similarly functioning element to provide an inverted version of the Vinp signal to the other current source 644. This reduces signal routing and only requires a simple and high speed inverting buffer 660.

Figure 8:
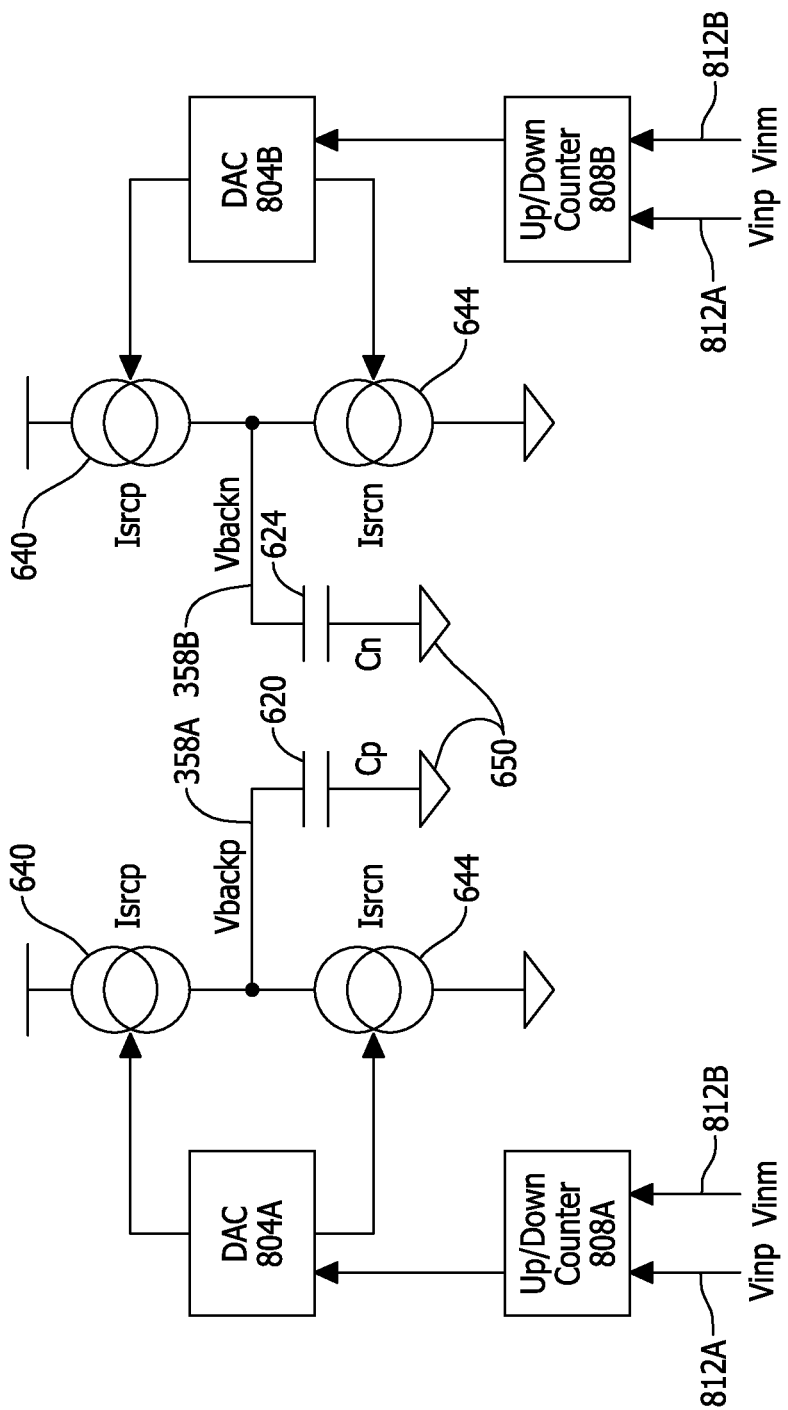
FIG. 8 illustrates a block diagram of an alternative embodiment of the replica transmitter as shown in FIG. 6.

FIG. 8 illustrates a block diagram of an alternative embodiment of the replica transmitter as shown in FIG. 6. This is but one possible embodiment and variations or changes to this configuration are possible. Identical elements are labeled with identical reference numbers.

For example, in this embodiment, the inputs Vinp, Vinm are provided on inputs 812A, 812B as shown to up down counters which generate a counter value based on the inputs. In one embodiment, the Vinp increases the counter value while a Vinm reduces the counter value. In other embodiments, other counter value effects may occur or be assigned to the values for Vinp and Vinm.

The output of the counters 808A, 808B represent or are related to the number of consecutive values of the signal values for Vinp and Vinm. In this embodiment, if there are not long strings of consecutive zero values or one values, the counter values will generally remain at or near zero. Strings of consecutive zero values or one values will change the counter output signal. The output of the counters 808A, 808B connect to DACs 804A, 804B which convert the counter values (a digital signal) to an analog signal. The DAC digital code would be incremented or decremented depending on whether a low-pass filtered version of the TX data stream is above or below a chosen reference level. The resolution of the DACs would be dictated by the BLW compensation accuracy requirements. The DAC output is provided to the current sources 640, 644 as shown. The DAC digital code would be incremented or decremented depending on whether a low-pass filtered version of the TX data stream is above or below a chosen reference level.

As a result, the consecutive zero values or one values adjust the current output by the current sources 640, 644, which in turn changes the values Vbackp, Vbackm, which are provided at nodes 358A, 358B. In one embodiment, the two outputs of the DAC are opposing values such that if the output is 5, then the other value is −5 when used for offset compensation. However, when configured for baseline wander, the values would be identical. It is also contemplated that baseline wander compensation may be performed after the offset cancellation. For example, values after offset cancellation could be +5 and −5, and then following baseline wander compensation, the values could change by another equal value of +2 to be for example +7 and −3, or by adding +5 to each value to form new values of +10 and 0. These values control the back bias. The counters 808A, 808B may also be configured as comparators and compare the incoming signal to a threshold or some other value.

Figure 9:
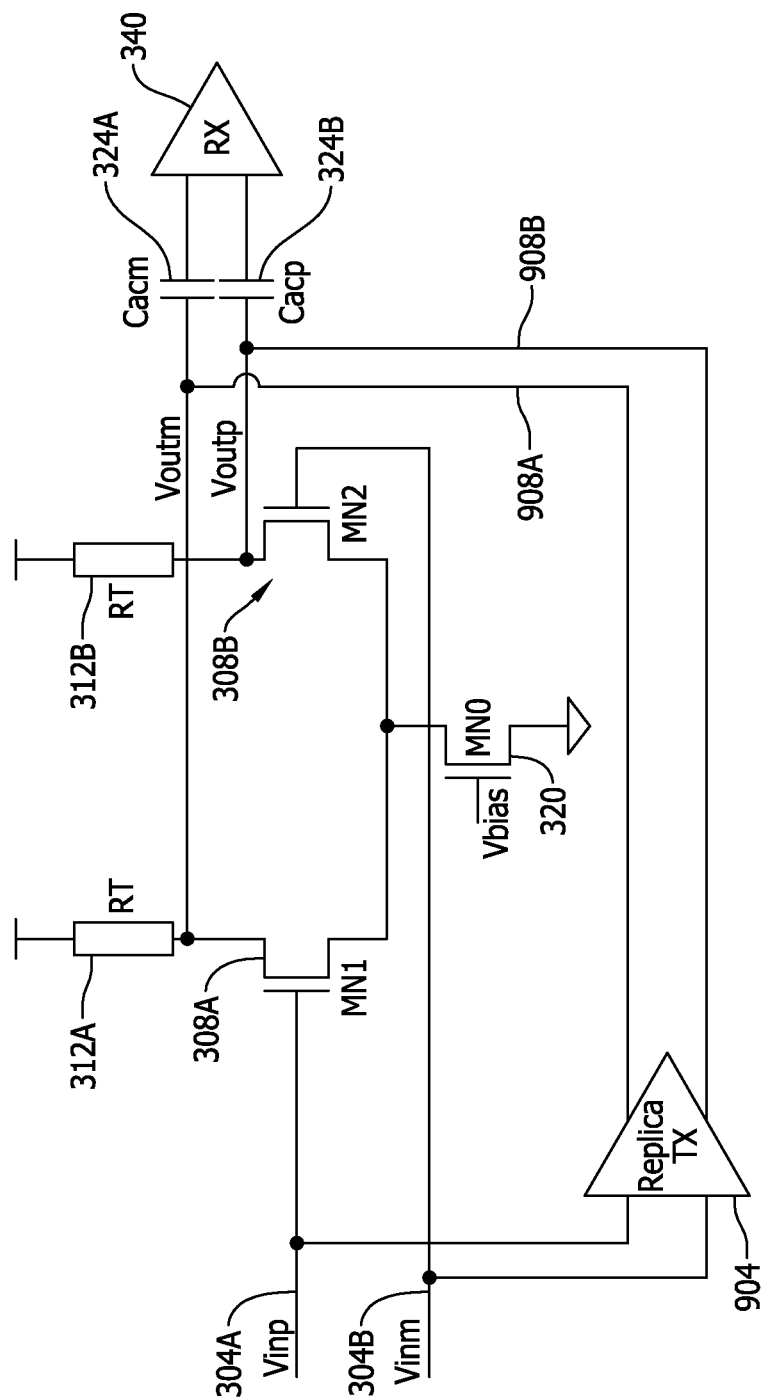
FIG. 9 illustrates a block diagram of an alternative embodiment of the system shown in FIG. 3.

FIG. 9 illustrates a block diagram of an alternative embodiment of the system shown in FIG. 3. This is but one possible embodiment and variations or changes to this configuration are possible. As compared to FIG. 3, identical elements are labeled with identical reference numbers.

The BLW compensator could also be implemented through similar programmable current sources tied directly to the TX outputs. These current sources could be used to add or subtract charge directly to the AC coupling caps. There would then be no requirement to be able to adjust the back-bias voltages of the differential input pair devices. In this embodiment, the replica circuit 904 generates two outputs 908A, 908B which are provided directly to the upstream side of the capacitors 324A, 324B. This adjusts the charge on the capacitors 324A, 324B to reduce baseline wander. This embodiment may be used if the transistors 358A, 358B do not have back bias terminals or capability.

Figure 10:
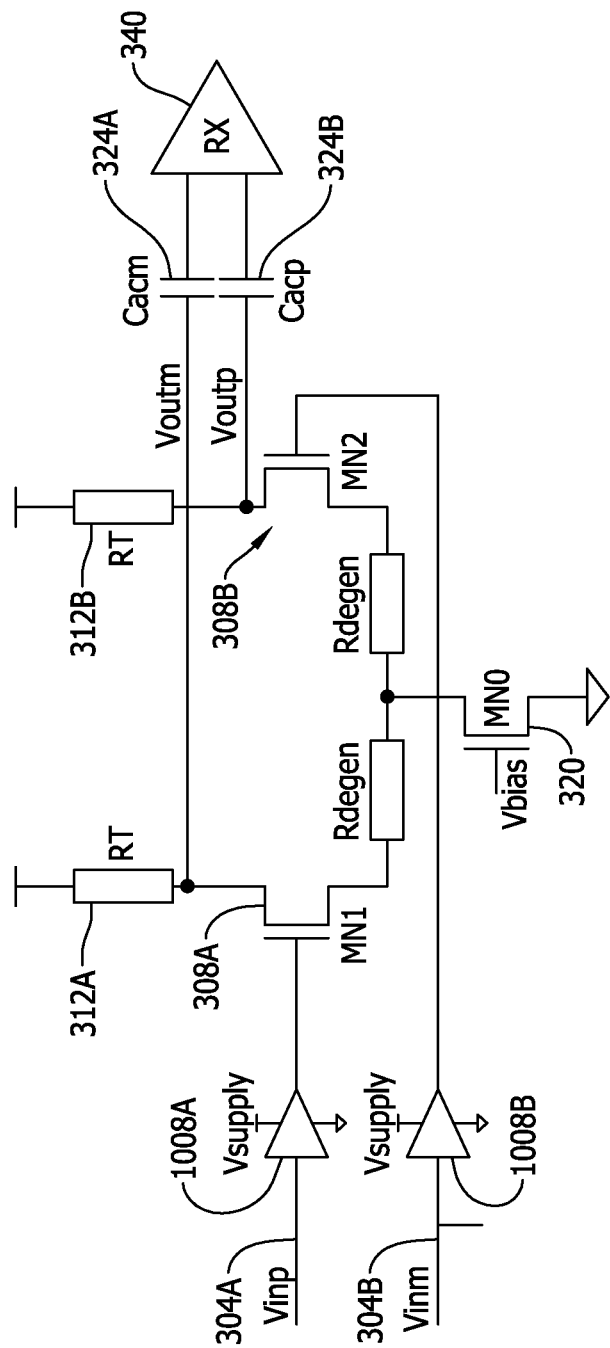
FIG. 10 illustrates an alternative embodiment of the baseline wander compensation system.

FIG. 10 illustrates an alternative embodiment of the baseline wander compensation system. This embodiment may be well suited to systems using a more linear transmitter with controlled input swing. This is but one possible embodiment and variations or changes to this configuration are possible. As compared to FIG. 3, identical elements are labeled with identical reference numbers.

If there is no access to the transmitter (driver or amplifier) back bias nodes or if back bias control is not configured, then other approaches may be used to independently control the swing on each of the differential outputs. In one embodiment, a more linear TX circuit with, for example degeneration on the differential pair NFETs (MN1 358A & MN2 358B). The inputs 304A, 304B provides the input signals Vinp, Vinm to buffers 1008A, 1008B. The buffers 1008A, 1008B receive a supply voltage Vsupply as shown and process the input signals Vinp, Vinm to generate the inputs to the gate terminals of the transistors Mn1 308A, and MN2 308B. The input swing on Vinp & Vinm can be adjusted independently to control the output swing. This swing could be controlled by using buffers, to drive Vinp & Vinm, with adjustable supply voltage. The supply voltage could be set by a similar circuit as shown in FIG. 6.

This embodiment uses degeneration on the differential pair NFETs (MN1 358A, and MN2 358B). The input swing on Vinp & Vinm could be adjusted independently to then control the output swing. This swing could be controlled by using buffers, to drive Vinp & Vinm, with adjustable supply voltage, Vsupply. The buffer supply voltage could be set by a similar circuit as shown in FIG. 3 or any of the alternative embodiments to FIG. 3. This embodiment is also suitable for use with transistors 358A, 358B that do not have back bias terminals.

Figure 11:
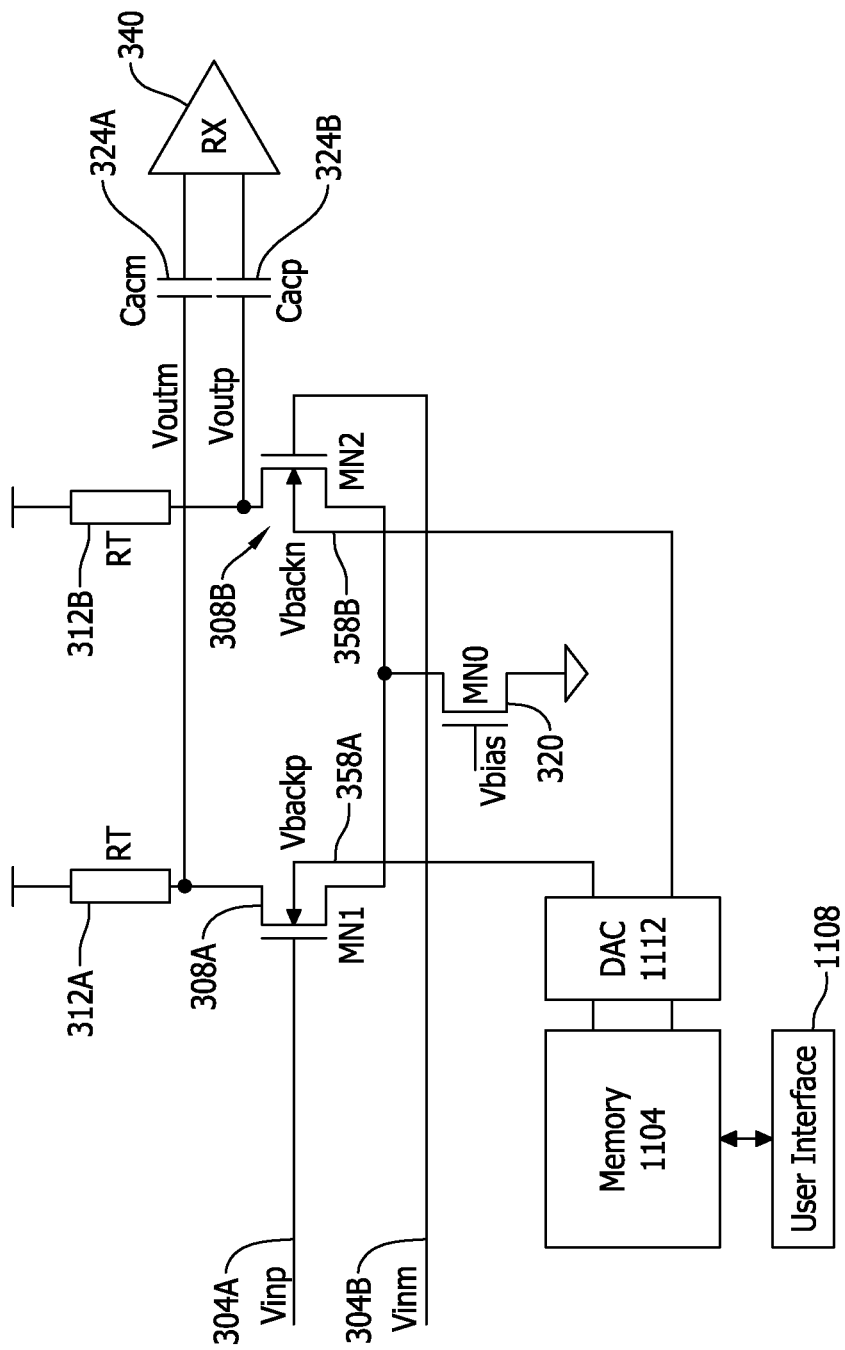
FIG. 11 illustrates an example embodiment of an offset correction system.

FIG. 11 illustrates an example embodiment of an offset correction system. As discussed above, the current sources, could be forced or programmed to different levels to introduce a fixed offset to the transmitter differential pair. This offset can be used to compensate for inherent offset of the TX circuit (for example if the VTs of MN1 & MN2 are not equal because of process mismatch) and could also be used to compensate for a mismatch in the DC content of the TX data stream. The end-user may also use this approach to adjust the output crossing levels depending on end-user system requirements. In this embodiment, the programmability of the current sources is controlled with software-controlled registers in memory or on chip, or through some automatic on-chip offset calibration based upon a low-frequency filtered feedback of the TX differential outputs. In this embodiment the offset correction would be programmed, such as through the user interface to account for system or environment introduced offset and remain at a fixed correct until new settings are introduced via the user interface. A DAC may convert the register values to an analog signal, which is then provided to the back bias terminal of the transistors 358A, 358B. For example, the programmed (based on stored values) transmitter offset cancellation could be initiated after the device power-up. In this embodiment, the offset cancellation is used on its own but could be combined with baseline wander compensation.

In one embodiment, the circuits shown herein may be configured to compensate for unbalanced DC content in the transmitted data (ie., there could more 1's than 0's or vice versa). This imbalance can result in a mismatch on the charge stored in the two AC coupling caps. The compensation can be accomplished in similar manner to the offset cancellation. In some situations, the imbalance may be known already as the user understands the content of the transmitted data, e.g. knows if and/or when the data contains strings of consecutive 1's and 0's. In reference to FIG. 11, the memory 1104 and DAC(s) 1112 can be pre-programmed to compensate for this or the data may be analyzed and using the user interface 1108, settings may be loaded into the memory 1104 to compensate for the unbalanced DC content of the transmitted data.

The compensation may be configured to account for process variation or other factors that cause unbalanced signals. The unbalanced issue may arise from unbalanced content in the data. The data should ideally comprise an equal number of high values and low values (1's & 0's), if it does not, then the DC average will not equal zero. This results in excess charge stored on one of the AC coupling caps. This can build up in charge, over time, will cause a problem on the receiver side. The end user may already understand the data content of the transmitted signal. As a result, the end user can therefore compensate for this expected imbalance by writing to the memory/DACs to store offset adjustment values, in a similar manner as was used for offset correction.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A baseline wander correction system comprising:
   one or more inputs configured to receive one or more input signals to be transmitted;
   a driver circuit configured to receive and amplify the one or more inputs, the driver circuit configured with one or more transistors having a back bias terminal;
   a replica circuit configured to:
      receive the one or more input signals;
      responsive to the one or more input signals, generate one or more back bias signals which are provided to the back bias terminal of the one or more transistors to change the back bias in response to the one or more inputs signals having consecutive one values or consecutive zero values; and
   one or more AC coupling capacitors between the driver circuit and a channel.

2. The system of claim 1 wherein the replica circuit includes control logic which is configured to control the output swing of Voutp and Voutm depending on the input signal characteristics.

3. The system of claim 1 wherein the replica circuit includes one or more current sources which increase or decrease current output responsive to the one or more input signals having consecutive one values or consecutive zero values.

4. The system of claim 1 wherein the replica circuit comprises two or more variable current sources which generate an output current based on one or more input signal, such that the output of the two or more variable current sources determines the back bias signal.

5. The system of claim 4 further comprising an inverting buffer configured to invert the value of the one or more input signals to create an inverted input signal and provide the inverted signal to at least one of the two or more variable current source.

6. The system of claim 4 further comprising one or more counters and one or more digital to analog converters, the one or more counters configured to adjust a counter value based on a number of ones and zeros in the one or more input signals.

7. The system of claim 1 wherein the baseline wander correction system is configured as a differential signal system and the one or more inputs is two inputs.

8. A method for correcting baseline wander in an amplified signal comprising:
   receiving one or more signals, the one or more signals represented by logic high values and logic low values;
   providing the one or more signals to an amplifier for amplification prior to transmission over a channel;
   providing back bias signals to one or more transistors within the amplifier to control the back bias of the one or more transistors;
   amplifying the one or more signals with the amplifier to create one or more amplified signals such that the back bias signal adjusts the turn on voltage of the one or more transistors, which changes the current flowing through the one or more transistors;

providing the one or more amplified signals to one or more AC coupling capacitors located between the amplifier and the channel.

9. The method of claim 8 wherein the amplified signal is a differential signal.

10. The method of claim 8 wherein changes to the current flowing through the one or more transistors changes a charge on the one or more AC coupling capacitors.

11. The method of claim 8 further comprising providing the one or more signals to a replication circuit configured to generate a back bias signal.

12. The method of claim 11 wherein the replication circuit includes one or more variable current sources that generate the back bias signal based on the one or more received signals.

13. The method of claim 12 further comprising generating a counter value with a counter, the counter value determined by the one or more signals.

14. The method of claim 8 further comprising retrieving a digital version of the back bias signal value from a memory and converting the digital version of the back bias signal value to the back bias signal with a DAC.

15. An offset correction system comprising:
one or more inputs configured to receive one or more input signals to be transmitted;
a driver circuit configured to receive and amplify the one or more input signals, the driver circuit configured with one or more transistors having a back bias terminal;
a memory configured to store offset adjustment values;
a user interface configured to access the memory to store the offset adjustment values in the memory;
a DAC configured to receive the offset adjustment values from memory, convert the offset adjustment values to back bias signals, and provide the back bias signals to the back bias terminal of the one or more transistors such that the back bias signals are adjusted in response to offset in the one or more input signals.

16. The system of claim 15 wherein the offset correction system is configured as a differential signal system and the one or more inputs is two inputs.

17. The system of claim 15 further comprising one or more AC coupling capacitors located between an output of the driver and a channel, wherein adjusting the back bias signals changes the charge on the one or more AC coupling capacitors.

18. The system of claim 15 wherein the back bias signal adjusts a turn-on voltage of the one or more transistors, which changes a current flowing through the one or more transistors.

19. The system of claim 15 further comprising testing an offset of the driver circuit and loading offset adjustment values via the user interface into the memory.

20. An unbalanced signal correction system comprising:
one or more inputs configured to receive two or more input signals to be transmitted, at least one of the two or more signals having imbalance;
a driver circuit configured to receive and amplify the one or more input signals, the driver circuit configured with one or more transistors having a back bias terminal;
a memory configured to store balance adjustment values;
an interface configured to store the balance adjustment values in the memory;
a DAC configured to receive the balance adjustment values from memory, convert the balance adjustment values to back bias signals, and provide the back bias signals to the back bias terminal of the one or more transistors such that the back bias signals are adjusted in response to unbalance in at least one of the two or more input signals.

\* \* \* \* \*